United States Patent [19]

Bobeck et al.

[11] 4,360,893

[45] Nov. 23, 1982

[54] MAGNETIC DEVICES AND METHOD OF MANUFACTURE

[75] Inventors: Andrew H. Bobeck, Chatham; James C. North, New Providence, both of N.J.

[73] Assignee: Bell Telephone Laboratories, Incorporated, Murray Hill, N.J.

[21] Appl. No.: 163,338

[22] Filed: Jun. 26, 1980

[51] Int. Cl.³ .............................................. G11C 19/08

[52] U.S. Cl. .......................................... 365/36; 365/32

[58] Field of Search ................................... 365/32, 36

[56] References Cited

U.S. PATENT DOCUMENTS

| | | | |
|---|---|---|---|
| 3,790,405 | 2/1974 | Levinstein | 117/201 |
| 3,792,452 | 2/1974 | Dixon et al. | 365/36 |
| 3,836,898 | 9/1974 | Bobeck et al. | 365/32 |
| 4,001,793 | 1/1977 | Henry et al. | 365/32 |

OTHER PUBLICATIONS

Proceedings of the IEEE-vol. 63, No. 8, Aug. 1975, pp. 1176–1195.

Journal of Applied Physics-vol. 44, No. 10; Oct. 1973, pp. 4753–4757.

G. Dearnaley et al., "Ion Implantation", North-Holland Publishing Company 1973.

*Primary Examiner*—James W. Moffitt

*Attorney, Agent, or Firm*—Peter A. Businger

[57] ABSTRACT

Magnetic devices exemplified by bubble devices depend upon functional magnetic layers initially produced by epitaxy and reduced to effectively thinned surface layers by ion implantation. Implantation is at well-defined energy spectral levels which minimize effect on surface layers and which predominantly affect a "buried layer". As a result, such affected layer acts as a boundary layer of a functional layer which is spaced away from an interface between a substrate and a deposited layer.

Commercial significance is primarily concerned with high bit density devices in which effectively thinned regions are less than 3 micrometers in thickness.

10 Claims, 4 Drawing Figures

MAGNETIC DEVICES AND METHOD OF MANUFACTURE

BACKGROUND OF THE INVENTION

1. Field of the Invention

The invention is concerned with magnetic devices. A category of particular significance, known as bubble devices, involves nucleation and propagation of cylindrical single wall domains of polarization opposite to that of surrounding regions.

2. History

The trend to increasing miniaturization is common to development in the various circuit technologies. Advanced development is concerned with large-scale integrated silicon circuitry in the semiconductor technology, with light guides and integrated optics in optical communications and with bubble devices in magnetic technology.

Bubble technology had its beginnings over a decade ago and has advanced through successive levels of sophistication. State of the art commercial devices, based on 2–4 μm diameter bubbles and 100K cells of 16 μm dimension, have been in use for some time.

An early quest for bubble-supporting material of appropriate magnetic properties has, at this time, resulted in near universal acceptance of thin layers of magnetic garnet supported by nonmagnetic garnet substrate. Such layers are almost invariably produced by liquid phase epitaxial (LPE) growth under deliberately super-cooled conditions as disclosed, e.g., in U.S. Pat. No. 3,790,405, issued Feb. 5, 1974 to H. J. Levinstein. Commercial devices are based on LPE layers of garnet in which desired anisotropy is tailored by multiple occupancy of dodecahedral sites and in which magnetic moment, $4\pi M$, is tailored by appropriate dilution of iron in tetrahedral sites. Growth is on gadolinium-gallium-garnet (GGG) substrates. Necessary magnetic properties have been available for field access devices (arrays in which bubble propagation is responsive to rotating magnetic fields coupled with a variety of patterned permalloy overlays) as disclosed, e.g., by A. H. Bobeck et al., "Magnetic Bubbles—An Emerging New Memory Technology", *Proceedings of the IEEE*, Vol. 63, No. 8, August 1975, pp. 1176–1195. Such layered material has also met requirements for new generations of current access devices at present experimental design rules.

While virgin LPE layers have generally sufficed as indicated, desired properties have sometimes been enhanced by subsequent treatment. Treatment has included annealing, diffusion, ion implantation, etc. Ion implantation has played a special role in bubble device fabrication as disclosed, e.g., in U.S. Pat. No. 3,792,452, issued Feb. 12, 1974 to M. Dixon et al., and by W. A. Johnson et al., "Differential Etching of Ion-Implanted Garnet", *J. Appl. Phys.*, Vol. 44, No. 10, October 1973, pp. 4753–4757. The book by G. Dearnaley et al., *Ion Implantation*, North-Holland Publishing Company, 1973 may serve as a general background reference.

Extremely sensitive site occupancy and/or strain balance responsible for necessary anisotropy may be altered by subtle changes produced by ion implantation. From an experimental standpoint, a variety of implantation boundaries have served to modify surface or embedded regions. Implantation has served to define preferred propagation routes, as well as to process entire layers. One aspect of ion implantation is well known. This involves the production of a capping, surface-damaged region produced by bombardment by low energy heavy ions. In general, such devices are provided with a surface region of in-plane easy magnetization direction designed to avoid "hard" bubbles. (Hard bubbles evidence a canted response to an applied field and tend to stray from prescribed routes.)

LPE garnet layers produced on dipped substrate wafers are characterized by thickness uniformity of a fraction of a μm as well as excellent composition uniformity. As in the past, state-of-the-art processing will be inadequate for new generation devices. Miniaturization requiring bubble diameter decrease to below 2 μm and eventually to submicron, is attended by more stringent uniformity requirements. Functional magnetic layers are needed which are of the same approximate thickness as bubble diameter; layers this thin must be even more closely controlled, and compositional inhomogeneity which formerly could be ignored must now be avoided.

Compositional inhomogeneity of initially grown material almost invariably results from distribution coefficients, $k \neq 1$. (Composition of growing solid differs from melt composition, thereby resulting in depletion or enrichment of interfacial melt during initial growth.) Steady state growth results in a stable, diffusion-limited δ-layer in the liquid, providing for gradual change of composition from solid layer to bulk melt composition. The thickness of the material grown under nonsteady state conditions may be of the order of tenths of a μm. As the total layer thickness decreases, material grown under nonsteady state conditions (which is characteristic of liquid growth techniques, such as, e.g., LPE) becomes determinative of critical magnetic properties—such as, e.g., bubble diameter, anisotropy, and other parameters.

SUMMARY OF THE INVENTION

The invention contemplates preparation of effectively thin (preferably 3 μm and less) epitaxially grown layers of magnetic material of excellent dimensional and compositional homogeneity. Such layers are essentially free of magnetic property variation ordinarily resulting from either thickness variation or composition variation, both characteristic of growth from liquid. Inventive procedures are usefully applied to the general category of devices in which domain walls are made to travel under external influence; a category of particular consequence concerns bubble devices which are dependent upon propagation of single wall, generally cylindrical domains. Methods for their fabrication, as well as resulting product constitute preferred species.

The invention is dependent upon ion implantation of ions of mass and velocity appropriate for selective alteration of layered, buried material. Implantation, while having relatively minor structural effect on magnetic material, significantly alters magnetic properties so that, in the preferred instance of bubbles, easy magnetization direction or magnitude of anisotropy ($k_u$) is altered to result in a relatively large effect on magnetic properties relevant to bubble support and propagation.

Typically, magnetic properties are altered within buried layers at a depth of no more than about 3 and preferably 2 μm as measured from the outer boundary of the effective device-significant magnetic layer. (This usually, but not necessarily, corresponds to a free surface.). Typically, altered layers are of a thickness of 0.5 μm and greater, although it is not required that such thickness be uniform. Where the purpose is to effectively eliminate thickness irregularity, relevant uniformity is of the unaltered rather than of the altered region.

Garnet layers of particular consequence in preferred bubble devices are generally considered to be capable of bubble support to a minimum diameter of a small fraction of a micrometer (about 0.3 μm). Since bubble layer thickness typically is approximately equal to bubble diameter, it is contemplated that implantation significantly affect a layer removed by at least such bubble dimension from the top of the device surface.

Considerations of ion-solid interactions lead to the conclusion that relatively large ions are preferred for implantation-produced damage. While greater energies are required for given penetration depth, the number of damaged sites per ion is increased and heat dissipation is generally decreased (as normalized in terms of damaged sites). Usual implantation procedures are useful in accordance with the invention but may cause excessive damage to desirably unaffected overlying material; in accordance with such conventional implantation procedures, likely ionic species are protons. A preferred embodiment, however, takes advantage of well-defined channeling directions which do permit use of larger ions, resulting in improved throughput, as well as lessened damage in overlying regions.

DETAILED DESCRIPTION

Figure 1:
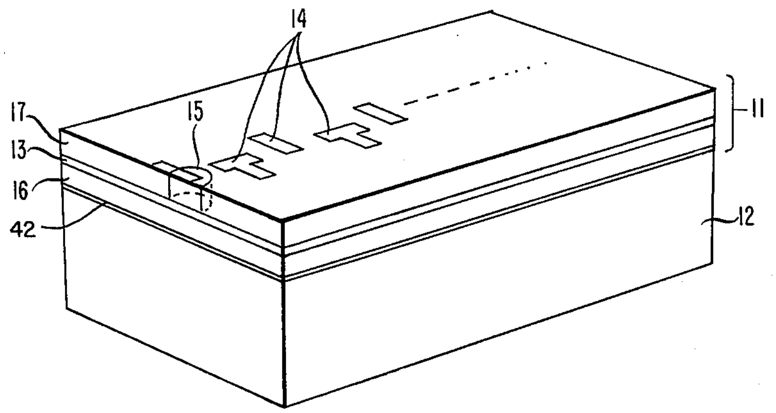
FIG. 1 schematically shows a portion of a magnetic bubble device comprising an ion implanted layer according to the invention.

Exemplary devices which are the subject of the inventive approach are "bubble" devices—devices in which single wall domains are made to propagate in order to serve some storage or logic function. Single wall domains may be regarded as magnetically saturated regions in which net dipole moment has a significant component orthogonal to a major plane, dipole alignment being opposite to that of surrounding magnetic material. Usual form assumed by bubble devices—a form common to that of other devices contemplated as well in accordance with the invention—is that of a thin supported layer of saturable magnetic material, such as a magnetic garnet material, supported on a substrate of differing magnetic properties, generally, but not necessarily, of nonsaturable magnetic properties. As presently constituted, bubble devices may utilize a nonmagnetic garnet substrate, such as, e.g., gadolinium-gallium-garnet (GGG), which has lattice dimensions suitably matched to that of the supported saturable material.

The invention is concerned with effective elimination of dimensional and compositional irregularities in domain magnetic material; both types of irregularities are characteristic of crystalline growth from liquid phase. Dimensional irregularities may result from the fact that wafers are finite in dimension, thereby resulting in inherent differences corresponding with growth at edge positions; irregularities may also result where a growing crystal is of a composition differing from the bulk liquid, resulting in compositional irregularities during an initial growth period. Technological significance is primarily concerned with such growth on a supporting substrate and, in fact, only under such circumstances is dimensional irregularity meaningful.

Compositional irregularities of the nature discussed, in turn, imply growth of compositions which may be regarded as mixtures rather than growth of single elements or single chemical compounds which do not admit of such irregularities.

The nature of the inventive processes is such that relatively small physical or chemical change is induced by implantation. Such change, however slight, is, nevertheless, sufficient to bring about measurable change in magnetic properties. Accordingly, a subtle change in, e.g., lattice dimension, may result in an orthogonal shift of easy direction of magnetization under some set of operating conditions.

These processes contemplate magnetic modification of a buried region of the magnetically saturable material layer by ion implantation. Use of ion implantation to selectively affect properties of buried material imposes certain requirements which are adequately met within contemplated device dimensions. Focus is legitimately on such dimensions which are suitably representative of miniaturized devices representative of the device generation now being developed. Magnetic domain wall devices of this generation depend upon saturable magnetic layers of an effective preferred thickness not exceeding 3 μm. Various constraints, some associated with wall energies, some associated with other practical limitations, such as lithographic capability, impose a minimum effective thickness likely to be about 0.3 μm.

A. Contemplated Device Structure

Contemplated device structure depends upon a layer of saturable magnetic material for supporting regions which are magnetically saturated; and in the exemplary case, which are bound by single domain walls, cylindrical in shape. In this embodiment, devices are known as bubble devices, and presence or absence of such bubble domains is representative of binary information. In operation, such domains are moved from position to position with such devices serving functions as memory and logic.

B. Dimensions

Dimensions of devices in accordance with the invention are necessarily small with the functional saturable magnetic layer having an effective preferred thickness no greater that about 3 and preferably 2 μm. From a device standpoint, such dimensions are required for attainment of high bit density. Bits, in the preferred instance, bubble domains, are of a size which, generally, is closely related to layer thickness.

In the instance of garnet materials which are representative of bubble devices as presently constituted, functional magnetic garnet layers are on nonmagnetic substrates, and have lattice parameters which closely match lattice parameters of the substrate. Nonmagnetic garnet of primary interest at this time is GGG (gadolinium-gallium-garnet).

C. Fabrication

Fabrication of devices of concern depends upon growth of crystalline saturable magnetic material from a liquid phase of a composition differing from the growing material. Where, as in the usual instance, substrate is determinative of orientation as well as morphology, epitaxial growth is implied. Generically, procedures of the contemplated nature are known as liquid phase epitaxial growth (LPE). In general, LPE layers are grown from deliberately super-cooled solution (solution of a composition which is supersaturated at temperature of growth).

D. Subsequent Processing

Processing following growth, the essence of the invention, is designed to effectively thin the grown region of saturable magnetic material by altering an underlying buried layered region. Alteration is accomplished by ion bombardment which designedly alters magnetic properties of the buried layered region so that the primarily magnetic function of the device takes place not within the entire grown region but only within a layered region above the altered region. The material upon which device function depends, while somewhat altered during ion bombardment, retains as-grown properties sufficient to permit device function. Ion bombardment may result, e.g., in reduced magnetic anisotropy in a buried region; alternatively, and under suitable implantation conditions, anisotropy may be enhanced in such region. In either case the buried region represents, according to the invention, a boundary of a functional bubble layer.

E. Ion Bombardment

Ion bombardment consistent with prior practice referred to as ion implanting may be channeling or nonchanneling. Channeling implies sufficient collimation and directionality in "channeling directions" (major crystallographic directions) such that ions travel through the lattice theoretically without nuclear interaction. This theoretical prescription is not met in actuality but does permit somewhat deeper penetration for given energy before statistical dechanneling results in random direction and increased probability of nuclear events with attendant damage. Acceptance angle for channeling may be within less than 2 degrees and typically within a fraction of a degree. Accurate control of attitude is required, generally resulting from a lens and collimation system for accelerated ions, together with a goniometer for adjusting wafer attitude.

Nonchanneling, or random ion bombardment, requires an accelerator as does channeling. Like channeling, usual apparatus constraints and wafer size calls for bombardment in a scanning mode.

The exact nature of the results of ion implantation is not completely known. A part of the effect which is measurable and upon which processing depends is referred to as damage. The damage which may take the form of local lattice expansion is physically measurable in terms of increased removal rate during etching. The accepted terminology "ion implantation" is used despite the fact that the desired effect does not depend upon actual retention, per se, of the ionic species.

F. Ionic Species

Ionic species are selected in accordance with a number of considerations. Most significant considerations involve relative freedom from damage in the functional layer, degree and depth of damage in the "implanted" layer, and the damage profile (damage vs. depth). Implantation damage to a buried layer results from introduction of ionic species at sufficiently high initial velocity, so that significant damage occurs only when velocity of travelling ions has been sufficiently reduced, primarily through interaction with electrons of the material.

These are two basic causes for decreasing velocity, namely electronic interactions, and nuclear interactions. The former produces no lattice damage. The likelihood of the latter is generally increased with increasing ion mass. (A neon ion with a nuclear charge of ten is ten times more likely to experience a nuclear event than is a proton with a charge of one. Also, when such a nuclear event occurs, more lattice atoms are likely to be displaced by the heavier neon ion than by the lighter proton having the same energy.) For the nonchanneling case, it is necessary to resort to the smallest possible nuclear mass—i.e., to the use of protons. Increasing mass may result in intolerable damage for device characteristics contemplated. In the channeling case in which nuclear events are precluded in principle, it is permitted to use larger ions.

Heavier ions are preferred in channeling due to the fact that damage is increased for given heat dissipation levels, thereby increasing throughput. This important economic consideration is not, to first order estimate, offset by other considerations. Dechanneling for the higher velocities required for given penetration depth is not rendered more likely, and damage profile, initially by dechanneling, is not significantly altered. Heavy ion implantation has been found desirable for surface processing in the fabrication of prior art device by reason of economy.

A magnetic bubble device according to the invention is schematically shown in FIG. 1 which shows magnetic layer 11 epitaxially deposited on substrate 12. Ion damaged layer 13 is a part of layer 11 which further comprises undamaged portions 16 and 17. Magnetic bubble 15 in layer 17 extends from the surface of layer 11 to the interface between layer 17 and implanted layer 13. Magnetic pattern 14 is on layer 11.

Also shown in FIG. 1 is a layer portion 42 of layer 11, such portion having been grown in the initial stages of epitaxial deposition of layer 11, i.e., before establishment of a steady state of growth.

Figure 2:
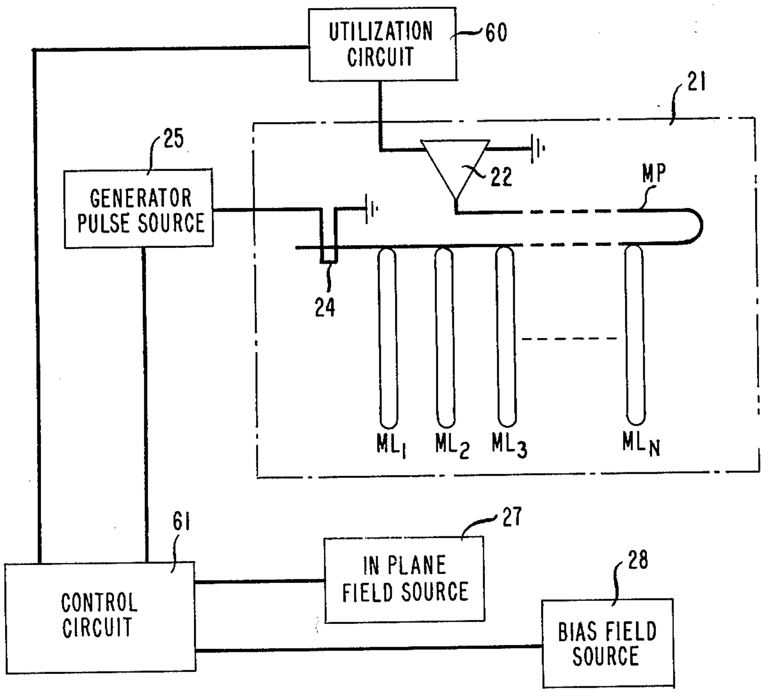
FIG. 2 schematically shows a magnetic bubble memory device according to the invention.

FIG. 2 schematically depicts a magnetic bubble memory comprising layer 21 of a material in which magnetic bubbles can be moved. A pattern of elements, typically of permalloy, is arranged to define minor loops $ML_1$, $ML_2$, . . . , $ML_N$ about which bubbles are recirculated during a propagation operation. A pattern of such elements also defines a major path MP along which bubbles move synchronously towards an expansion detector arrangement 22. An electrical conductor 24 defining a bubble generator is coupled to layer 21 at an end of path MP other than that at which the expansion arrangement is coupled. Conductor 24 is shown connected between a generator pulse source 25 and ground.

Movement of bubbles in the various loops and paths takes place in response to a magnetic field rotating in the plane of bubble movement. A source of such field is represented by block 27. A source of a bias field for maintaining bubbles in layer 21 at a selected operating diameter is represented by block 28.

Figure 3:
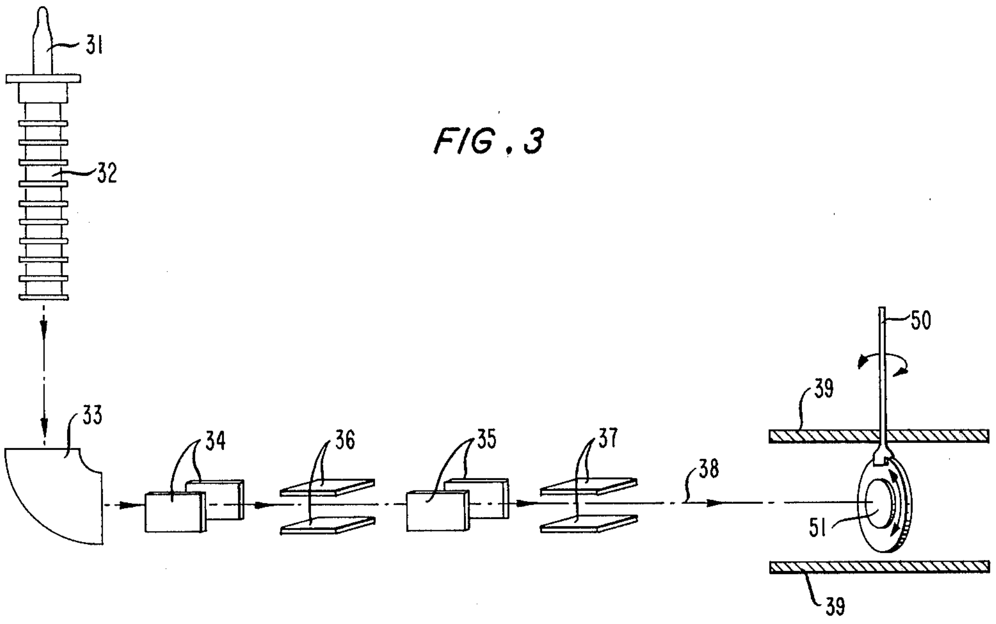
FIG. 3 schematically shows apparatus as may be used in the manufacture of devices according to the invention.

FIG. 3 shows implantation apparatus suitable for the processing of devices of the invention. Specifically shown are ion source 31, ion accelerator 32, ion analyzing magnet 33, pairs of ion beam deflection plates 34 and 35 for beam displacement in an x-direction, pairs of ion beam deflection plates 36 and 37 for beam displacement in a y-direction, ion beam 38, target sample housing 39, two-axis goniometer system 50, and target sample 51.

Figure 4:
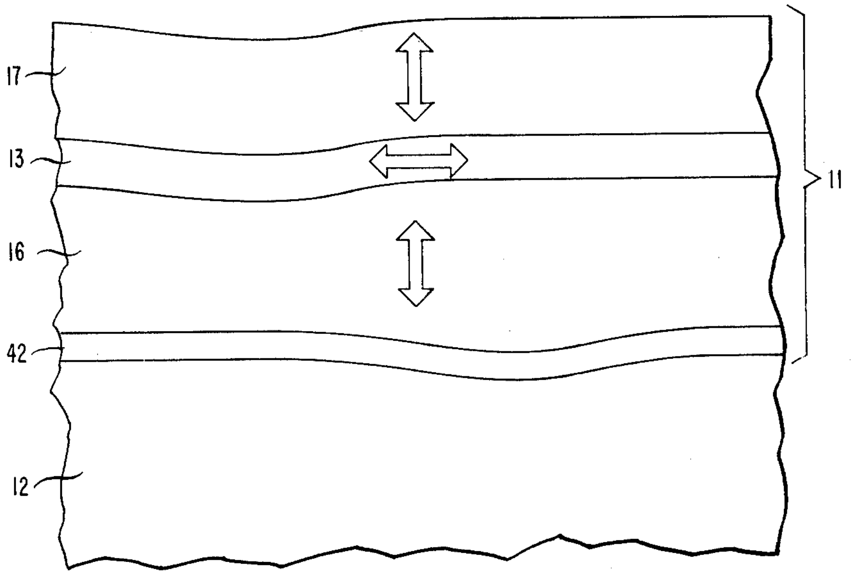
FIG. 4 schematically shows a portion of a magnetic bubble device according to the invention and illustrates benefits derived from a buried layer.

FIG. 4 shows nonmagnetic substrate 12, magnetic film 11 comprising material 42 grown under nonsteady state conditions, layer 16 having easy direction of magnetization perpendicular to the substrate, layer 13 having easy direction of magnetization parallel to the substrate, and magnetic bubble supporting layer 17 having easy direction of magnetization perpendicular to the substrate. Layer 13 is a buried layer which has been damaged by ion implantation according to the invention. It can be seen from FIG. 4 that bubble supporting layer 17 has constant thickness independent of irregularities at the interface of substrate 12 and epitaxial layer 11, and independent also of irregularities at the outer surface of layer 11. Constant layer thickness 17 is also assured among different, separately produced and processed wafers having an implanted layer according to the invention.

EXAMPLE 1

Protons are implanted in a layer of magnetic bubble material in a nonchanneling direction. A damaged layer is produced at a depth of approximately 0.6 micrometer per 100 kV accelerating voltage, depth being measured from the surface on which protons are incident.

EXAMPLE 2

Protons are implanted in a layer of magnetic bubble material in a channeling direction. A damaged layer is produced at a depth of approximately 1 micrometer per 100 kV accelerating voltage.

EXAMPLE 3

Helium ions are implanted in a layer of magnetic bubble material in a channeling direction. A damaged layer is produced at a depth of approximately 0.8 micrometer per 100 kV accelerating voltage.

EXAMPLE 4

Neon ions are implanted in a layer of magnetic bubble material in a channeling direction. A damaged layer is produced at a depth of approximately 0.3 micrometer per 100 kV accelerating voltage.

We claim:

1. Magnetic device comprising a supported layer of domain magnetic material on a substrate, said device comprising (i) first means for nucleating single wall magnetic domains within a functional layer within the said supported layer, (ii) second means for propagating such single wall domains within the said functional layer, and (iii) third means for detecting the presence of such single wall domains within the said functional layer, the thickness of the said functional layer being less than the thickness of the said supported layer, characterized in that the said functional layer is spaced from the interface between the said supported layer and the said substrate by a layered region having magnetic properties altered by implantation of ions, implanted ions having traversed the said functional layer.

2. Device of claim 1 in which said ions are protons and in which implantation is in a nonchanneling direction.

3. Device of claim 1 in which implantation is in a direction which essentially is a channeling direction.

4. Device of claim 3 in which implantation is in a direction which deviates from said channeling direction by less than 2 degrees.

5. Device of claim 1 in which said functional layer has a thickness which is less than or equal to 3 micrometers.

6. Device of claim 5 in which said functional layer has a thickness which is less than or equal to 2 micrometers.

7. Method for making a magnetic device comprising a supported layer of domain magnetic material on a substrate, said device comprising (i) first means for nucleating single wall domains within a functional layer within said supported layer, (ii) second means for propagating such single wall domains within the said functional layer, and (iii) third means for detecting the presence of such single wall domains within the said functional layer, the thickness of the said functional layer being less than the thickness of the said supported layer, said method being characterized by, a step of ion implantation into said layer of domain magnetic material, such implantation being by means of ions having energy and direction such that magnetic properties are predominantly affected in a region which is spaced from the interface between the said supported layer and the said substrate.

8. Method of claim 7 in which said ions are protons and in which said direction is a nonchanneling direction.

9. Method of claim 7 in which said direction is essentially a channeling direction.

10. Method of claim 9 in which said direction deviates from a channeling direction by less than 2 degrees.

* * * * *